United States Patent
Ichikawa

(10) Patent No.: US 8,835,951 B2
(45) Date of Patent: Sep. 16, 2014

(54) LIGHT EMITTING DEVICE

(75) Inventor: Masatsugu Ichikawa, Tokushima (JP)

(73) Assignee: Nichia Corporation, Anan-shi (JP)

(*) Notice: Subject to any disclaimer, the term of this patent is extended or adjusted under 35 U.S.C. 154(b) by 791 days.

(21) Appl. No.: 13/079,234

(22) Filed: Apr. 4, 2011

(65) Prior Publication Data

US 2011/0248304 A1 Oct. 13, 2011

(30) Foreign Application Priority Data

Apr. 7, 2010 (JP) .................................. 2010-88330

(51) Int. Cl.
*H01L 33/00* (2010.01)
*H01L 23/00* (2006.01)
*H01L 33/50* (2010.01)
*H01L 33/60* (2010.01)

(52) U.S. Cl.
CPC ..... *H01L 33/505* (2013.01); *H01L 2224/73265* (2013.01); *H01L 24/32* (2013.01); *H01L 2224/48091* (2013.01); *H01L 2933/0091* (2013.01); *H01L 33/60* (2013.01); *H01L 33/507* (2013.01); *H01L 2924/01322* (2013.01)
USPC ............................................. 257/98; 257/99

(58) Field of Classification Search
CPC ..... H01L 33/502; H01L 33/504; H01L 33/50; H01L 33/60; H01L 33/62
USPC .................... 257/88–103, E33.001
See application file for complete search history.

(56) References Cited

U.S. PATENT DOCUMENTS

| | | | |
|---|---|---|---|
| 7,304,326 B2 * | 12/2007 | Suehiro et al. | 257/98 |
| 8,399,267 B2 * | 3/2013 | Ling | 438/22 |
| 8,405,104 B2 * | 3/2013 | Streubel et al. | 257/98 |
| 8,704,254 B2 * | 4/2014 | Trottier et al. | 257/98 |
| 2006/0060867 A1 | 3/2006 | Suehiro | |
| 2007/0139949 A1 | 6/2007 | Tanda et al. | |
| 2009/0121253 A1 | 5/2009 | Abe | |

FOREIGN PATENT DOCUMENTS

| | | |
|---|---|---|
| JP | 2001-148512 | 5/2001 |
| JP | 2002-141559 | 5/2002 |
| JP | 2006-108640 | 4/2006 |
| JP | 2007-165811 | 6/2007 |
| JP | 2007-287713 | 11/2007 |
| JP | 2009-4698 | 1/2009 |
| JP | 2009-267039 | 11/2009 |

* cited by examiner

*Primary Examiner* — Cuong Q Nguyen
(74) *Attorney, Agent, or Firm* — Morrison & Foerster LLP

(57) ABSTRACT

The first wavelength converting member, the light emitting element, and the second wavelength converting member are disposed in this order toward the opening of the recess portion on the bottom surface of the housing member through a light transmissive supporting member, and spaced away from the side surface of the recess portion. The first wavelength converting member is a plate shape member made of a composite of an inorganic binder made of an inorganic material and a fluorescent material. A light scattering surface is formed on at least a portion of the side surface of the recess portion, which is irradiated with the light emitted from the side surfaces of the wavelength converting member in parallel with the principal surface of the first wavelength converting member.

12 Claims, 5 Drawing Sheets

LIGHT EMITTING DEVICE

BACKGROUND OF THE INVENTION

This application claims priority from Japanese Patent Application No. 2010-88330, filed Apr. 7, 2010, the content of which is incorporated herein by reference, in its entirety.

FIELD OF THE INVENTION

The present invention relates to a light emitting device capable of effecting color-mixing of light emitted from a light emitting element and light obtained through wavelength conversion of a part of the original light, thereby emitting light of a different color.

DESCRIPTION OF RELATED ART

A semiconductor light emitting element such as light emitting diode is small in size, has high power efficiency and emits light with clear color. The semiconductor light emitting element also has such advantages as almost free from blowout, excellent startup performance, and high durability to vibration and repetitive operations of turning on and off. There have been developed a light emitting device capable of emitting light of various wavelengths, which is obtained by, according to the principle of color mixing of light, combining source light emitted from a light emitting element and light emitted from a wavelength converting member which is excited by the source light and is capable of emitting light of different wavelength than that of the source light. Such light emitting devices are used as various light sources. Particularly in recent years, such light emitting devices have attracted much attention as a next-generation illumination light sources of lower power consumption and longer service life to replace fluorescent lamps, and there is increasing needs for higher light emitting output power and improvements in light emitting efficiency. There is also a demand for light source of higher brightness in projectors such as automobile headlight and in floodlights.

For such light emitting devices, JP 2002-141559A proposes structures as shown in FIGS. 9(a) and 9(b). The light emitting semiconductor chip assembly 72 shown in FIG. 9(a) has a constitution in which a light emitting diode chip 78 is fixed on a fluorescent material chip 74 through a transparent adhesive 76. The fluorescent material chip 74 has a fluorescent material layer 82 on a base material 80 made of a transparent material such as silica or alumina or an opaque material with high light reflectivity. The fluorescent material layer 82 has a constitution in which a fluorescent material is dispersed in a resin material. FIG. 9(b) shows a cross-sectional view of a light emitting device 92 constituted by using the light emitting semiconductor chip assembly 72. The light emitting device 92 has an anode lead 88 and a cathode lead 90, and the light emitting semiconductor chip assembly 72 is fixed in the cap portion 90a provided at a top end of the cathode lead 90. An anode electrode 84 and a cathode electrode 86 of the light emitting semiconductor chip assembly 72 are respectively connected to the anode lead 88 and the cathode lead 90. The portion around the light emitting semiconductor chip assembly 72 is enclose with a protective adhesive material 96 having a light scattering agent 94 dispersed therein.

The light emitting device shown in FIGS. 9(a) and 9(b) has the phosphor chip 74 fixed on the back surface of the light emitting diode chip 78, which allows an increase in optical output compared to a light emitting device in which the back surface of the light emitting diode chip 78 is directly adhered in the cup portion 90a of the cathode lead. The reason for this is considered as below. In the case where the back surface of the light emitting diode chip 78 is directly adhered in the cup portion 90a of the cathode lead by using a silver paste and the like, light emitted from the back surface of the light emitting diode chip 78 is to be reflected by the silver paste. However, the reflectance of a silver paste is not sufficiently high and, in addition, a large proportion of the reflected light returns to the light emitting diode chip 78 and is absorbed, resulting in a decrease in the optical output. Adhering the fluorescent material chip 74 on the back surface of the light emitting diode chip 78 decreases the proportion of the light emitted from the back surface of the light emitting diode chip 78 returning in the light emitting diode chip 78, so that the light can be extracted outside efficiently through the fluorescent material chip 74, and thus improves the optical output. Due to the effect of the light scattering agent 94 dispersed in the protective adhesive material 96, the colors of light emitted from the light emitting diode chip 78 and the fluorescent material chip 74 are mixed, so that color unevenness of emitted light can be suppressed.

However, with such a conventional light emitting device, sufficient improvement in both color unevenness and optical output has been difficult to obtain. That is, the light emitting device as shown in FIGS. 9(a) and 9(b), the fluorescent material layer 82 for converting the wavelength is provided only beneath the light emitting diode chip 78, so that the light emitted from the bottom surface of the light emitting diode chip 78 passes through the fluorescent material layer 82 of the fluorescent material chip 74 but the light emitted from the top surface or the side surfaces of the light emitting diode chip 78 does not pass the fluorescent material layer 82. Accordingly, color unevenness tends to occur. Mixing the colors of emission from the light emitting diode chip 78 and the fluorescent material chip 74 to suppress the color unevenness sufficiently requires a large amount of the light scattering agent 94 to be dispersed around the light emitting diode chip 78 and the fluorescent material chip 74. However, if a large amount of the light scattering agent 94 is dispersed around the light emitting diode chip 78, the amount of light scattered by the light scattering agent 94 returning in the light emitting diode chip 78 increases, which results in an increase in the proportion of light absorbed in the light emitting diode chip 78. Also, in the light emitting device as shown in FIGS. 9(a) and 9(b), the light emitting diode chip 78 may be enclosed in the fluorescent material layer 82, but the returning light to the light emitting diode chip 78 can still occur by scattering at the fluorescent material particles included in the fluorescent material layer 82, and as a result, the amount of light absorbed in the light emitting diode chip 78 increases. Therefore, an improvement in the color unevenness will lead to a reduction in the light extracting efficiency. Thus, it has been difficult to reduce the color unevenness and to increase the light extracting efficiency at the same time.

Accordingly, an object of the present invention is to provide a novel light emitting device that can improve both the color unevenness and light extracting efficiency of the light emitting device at the same time.

SUMMARY OF THE INVENTION

The invention provides a light emitting device that includes a package having a recess portion opening upwardly. The recess portion has a side surface and a bottom surface. The device also includes a light emitting element having a light emitting layer including a semiconductor, and a wavelength converting member configured to absorb part of light emitted from the light emitting element, convert the absorbed light into light of a different wavelength and emit the converted light. The light emitted from the light emitting element and the light converted by the wavelength converting member are mixed and emitted from an opening of the recess portion, the wavelength converting member includes a first wavelength converting member disposed under the light emitting element and a second wavelength converting member disposed on at least the light emitting element, the first wavelength converting member is of a plate shape and includes a composite of an inorganic material and a fluorescent material. The device further includes a supporting member disposed between the first wavelength converting member and the bottom surface of the package, and a light scattering surface formed on at least a portion of the side surface of the recess portion which is irradiated with incident light emitted from a side surface of the first wavelength converting member in a direction parallel to a principal surface of the first wavelength converting member. The light emitting element and the wavelength converting member are apart from the side surface of the package.

According to the present invention, the first wavelength converting member, the light emitting element, and the second wavelength converting member are stacked in this order on the bottom surface of the housing member through the light transmissive supporting member. Therefore, light can be extracted efficiently from the underside of the light emitting element. Further, placing the first wavelength converting member made of an inorganic binder and a fluorescent material beneath the light emitting element and placing the second wavelength converting member over the first wavelength converting member suppress the occurrence of the color unevenness while maintaining high light extracting efficiency. That is, the first wavelength converting member located beneath the light emitting element may be a plate shape member which is a composite of an inorganic binder and a fluorescent material, but the difference in the refractive index between the inorganic binder and the fluorescent material is relatively small and therefore, the light passing through the first wavelength converting member is not much scattered. Therefore, contrary to the case using a fluorescent material layer 82 made of a resin and fluorescent material particles shown in FIGS. 9(*a*) and 9(*b*), the amount of returning light to the light emitting element due to the scattering in the first wavelength converting member is small. On the other hand, in the plate shape first wavelength converting member, light tends to propagate in the lateral direction which results in strong emission at the end surfaces of the first wavelength converting member, thus, color unevenness tends to occur. Therefore, occurrence of color unevenness by the first wavelength converting member can be suppressed by forming a light scattering surface on at least a portion of the side surface of the recess portion to where the light emitted from a side surface of the first wavelength converting member in a direction parallel to the principal surface of the first wavelength converting member is incident. The first wavelength converting member and the light emitting element are spaced apart from the side surface of the recess portion where the scattering surface is formed, so that the amount of light returning to the light emitting element due to the scattering surface is relatively small.

DETAILED DESCRIPTION OF PREFERRED EMBODIMENTS

Figure 1:
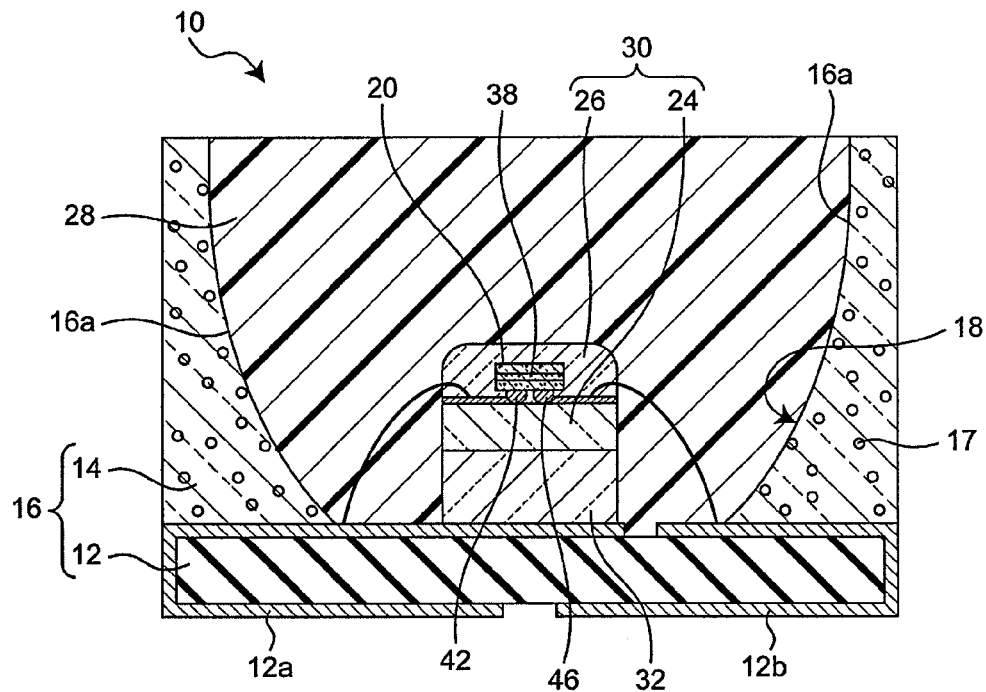
FIG. 1 is a schematic sectional view showing a light emitting device according to the first embodiment of the present invention.

Preferred embodiments of the present invention will be described below with reference to the accompanying drawings. The drawings show the objects schematically, and information included therein such as layout, dimensions, proportion and shape may be different from the actual. The members using the same reference numeral as that of another embodiment in the respective embodiments denote the same or corresponding members, and description thereof may be omitted.

In the present specification, the terms "up" and "down" are used also to indicate the side of the light emitting device where emitted light is extracted and the opposite side, respectively. For example, the term "upward" indicates the direction of the light emitting device where emitted light is extracted, and the term "downward" indicates the opposite direction. Also, the term "top surface" indicates the surface one the side of the light emitting device where light is extracted, and "bottom surface" indicates the surface on the opposite side. The term "inside" used in relation to the light emitting device indicates a position nearer to the light emitting layer of the light emitting device and the term "outside" indicates a position on the opposite side. The term "light transmissive" in the present specification indicates a transmissivity of 10% or more at the emission wavelength of the light emitting element. The term "mixing" of light means spatial mixing of light having different values of chromaticity so that the resultant light is perceived by the human eye as light having chromaticity different from that of each original light. The term "refractive index" indicates the refractive index at the emission wavelength of the light emitting element.

Figure 2:
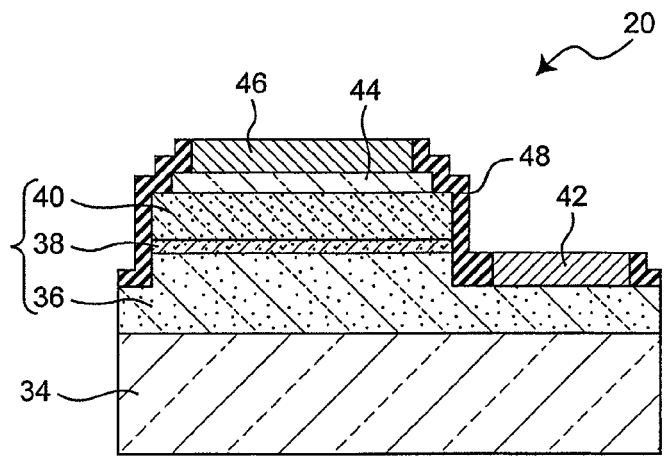
FIG. 2 is a schematic sectional view showing an example of a light emitting element used in the light emitting device of FIG. 1.

FIG. 1 is a schematic sectional view showing a light emitting device 10 according to the first embodiment of the present invention. A light emitting element 20 and a wavelength converting member 30 for absorbing a part of the light emitted from the light emitting element 20 and converting the wavelength of the light to a different wavelength are housed in a package 16 (housing member). The package 16 of the present embodiment is constituted with a mounting substrate 12 which is a flat plate shape insulating member having a wiring formed thereon and a side wall having an annular inner wall 14 formed on the mounting substrate 12. The light emitting element 20 has a structure such as shown in FIG. 2, for example, which includes a light emitting layer 38 made of a semiconductor. Further, each of the two electrodes 42, 46 of the light emitting element 20 are connected to the respective wiring 12a, 12b of the mounting substrate 12 through an electrode formed on the wavelength converting member 30 and a wire, so that the current can be supplied from the outside.

Figure 6:
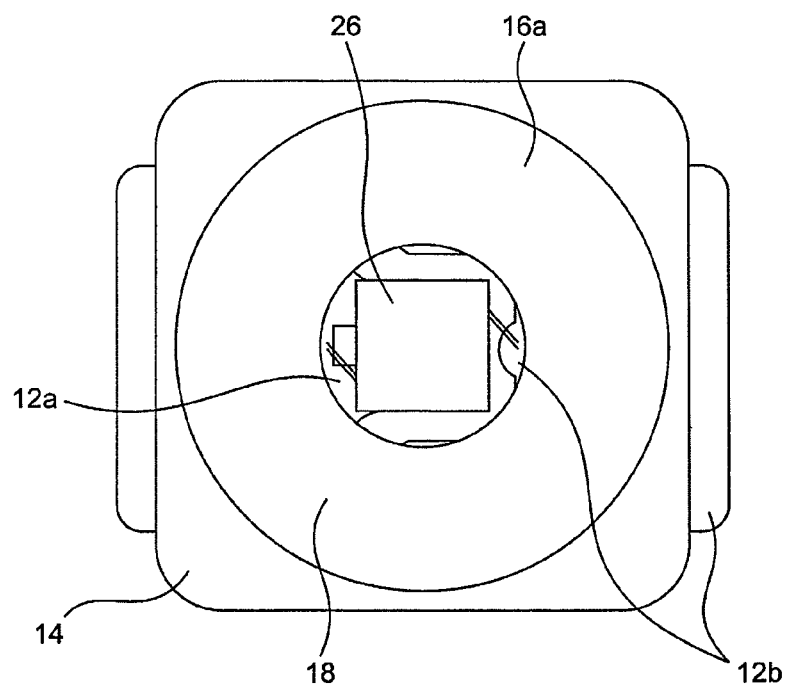
FIG. 6 is a schematic top view showing an example of light emitting device according to the first embodiment of the present invention.

A recess portion 16a opening upward is defined in the package 16 to contain the light emitting element 20 and the wavelength converting member 30. Moreover, in the present embodiment, the recess portion 16a is formed in a mortar shape so that the emission from the light emitting element 20 and the wavelength converting member 30 can be extracted efficiently. That is, the recess portion 16a is defined by the inner surface of the side wall 14 of the package 16 and the top surface of the mounting substrate 12, in which, the inner surface of the side wall 14 of the package 16 has a circular shape with its inner diameter increasing upwardly. Thus, the recess portion 16a is formed in a mortar shape and the incident light on the surface of the recess portion 16a can be efficiently extracted from the top. Further, a light transmissive sealing member 28 is filled in the recess portion 16a. The recess portion 16a of the package 16 shown in FIG. 1 is, as shown in FIG. 6, in a circular shape in a plan view, and a rectangular light emitting element 20 and a rectangular wavelength converting member 30 arranged at a center portion thereof. Also, the light emitting element 20 and the wavelength converting members 24, 26 are disposed in parallel with the bottom surface of the recess portion 16a.

In the present embodiment, the wavelength converting member 30 includes a first wavelength converting member 24 which is a plate shape member made of a complex of an inorganic binder made of an inorganic material and a fluorescent material, and a second wavelength converting member 26 made of a light transmissive resin having a fluorescent material dispersed therein. On the bottom surface of the package 16, the first wavelength converting member 24, the light emitting element 20, and the second wavelength converting member 26 are disposed in this order through the light transmissive member 32, toward the opening of the recess portion 16a and spaced away from the side surface of the recess portion 16a. The first wavelength converting member 24 is disposed under the light emitting element 20 to support the light emitting element 20, and the second wavelength converting member 26 is disposed to cover the top surface and the side surfaces of the light emitting element 20. The wavelength of a part of the light emitted from the top surface and the side surfaces of the light emitting element 20 is mainly converted by the second wavelength converting member 26 and a part of the light emitted from the bottom surface of the light emitting element 20 is mainly converted by the first wavelength converting member 24. The wavelength-converted light and the original light from the light emitting element 20 are mixed to obtain the light of a desired color. For example, in the case where the light emitting element 20 emits blue light and the wavelength converting member 30 emits yellow light, a white light can be obtained by mixing them. In the case where a light emitting element 20 capable of emitting ultraviolet light is used, light of a desired color can be obtained by converting light through the wavelength converting member 30.

In the light emitting device 10 of the present embodiment, the first wavelength converting member 24, the light emitting element 20, the second wavelength converting member 26, are formed in this order on the bottom surface of the package 16 through the light transmissive supporting member 32, so that light can be extracted efficiently from the bottom of the light emitting element 20 through the first wavelength converting member 24 and the supporting member 32. Further, the wavelength converting members 24, 26 are provided respectively to both the over and beneath the light emitting element 20, so that relatively uniform wavelength conversion can be performed. Also, a plate shape member which is a composite of an inorganic binder made of an inorganic material such as glass or sapphire is used as the first wavelength converting member 24 arranged beneath the light emitting element 20, so that the returning light by scattering at the wavelength converting member 24 can be suppressed. That is, the difference in the refractive index between the inorganic binder and the fluorescent material in the first wavelength converting member 24 is relatively small, so that the light passing through the first wavelength converting member 24 is not so much subjected to scattering, and therefore, the amount of light returning to the light emitting element 20 while passing through the first wavelength converting member 24 is small.

Figure 4:
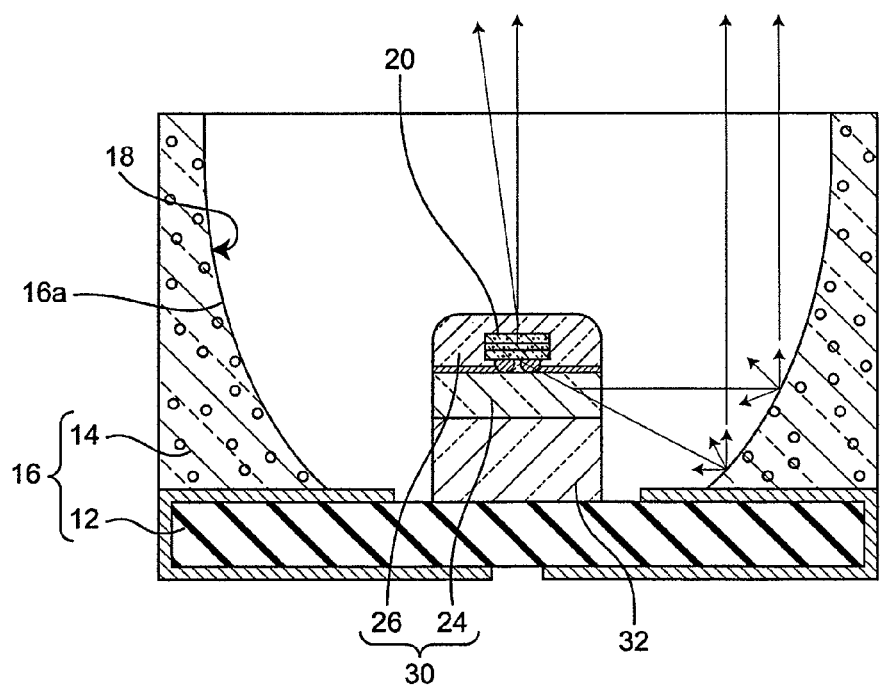
FIG. 4 is a schematic view illustrating the traveling directions of light in the light emitting device of FIG. 1.

A small amount of scattering in the first wavelength converting member 24 disposed beneath the light emitting element 20 on the other hand facilitates the wave guiding in the first wavelength converting member 24, which results in a tendency for strong emission at the side surfaces of the first wavelength converting member 24. This may become another cause of color unevenness. Accordingly, in the present embodiment, a light scattering surface 18 is formed on the side surface defining the recess portion 16a. For example, the side surface of the recess portion 16a can be formed as a light scattering surface 18 by dispersing light transmissive particles 17 such as $TiO_2$ in a light transmissive mother material which forms the side wall 14 of the package 16. Light incident to the side surface of the recess portion 16a of the package is scattered by the particles 17. Thus, as shown in FIG. 4, among the light emitted from the light emitting element 20 and the wavelength converting member 30, the light irradiated to the side surface of the recess portion 16a is scattered by the surface and then extracted, and in this light scattering process, the light from the light emitting element 20 and the light from the wavelength converting member 30 are mixed, which suppresses the color unevenness.

Further, in the present embodiment, the light emitting layer 38 of the light emitting element 20 is spaced apart from the side surface of the recess portion 16a of the package, so that the proportion of the light returning to the light emitting element 20 after scattered by the light scattering surface 18 of the recess portion 16a is small. Specifically, defining the recess portion 16a with upwardly increasing inner diameter increases the amount of light scattered at the side surface of the recess portion 16a and directing upward, so that the proportion of the returning light to the light emitting element 20 can be further reduced. Therefore, even in the case where the amount of the particles 17 sufficient to suppress the occurrence of the color unevenness is scattered in the side wall 14 of the package 16, there will be practically no reduction in the optical output.

The light scattering surface 18 is preferably formed as wide as possible on the side surface of the recess 16a, but is formed, at least in a region of the side surface of the recess portion 16a irradiated by the light emitted in parallel direction to the principal surface of the first wavelength converting member 24 from the side surfaces of the first wavelength converting member 24. With this arrangement, the emission from the side surface of the first wavelength converting member 24 can be efficiently scattered to suppress the color unevenness. Preferably, the light scattering surface 18 is formed on the regions including the region irradiated with the light emitted in parallel with the principal surface of the first wavelength converting member 24 from the side surfaces of the first wavelength converting member 24, and all the regions below it. Further preferably, the light scattering surface 18 is formed on all the regions below the position irradiated with the light emitted in parallel with the principal surface of the light emitting element 20 from the light emitting layer 38 of the light emitting element 20. Most preferably, the light scattering surface 18 is formed on the entire side surface of the recess portion 16a. With such arrangements, the color unevenness can be suppressed efficiently.

Further, in the present embodiment, the side surface of the recess portion 16a is used for the light scattering surface, but the light scattering surface can be formed on the bottom surface of the recess portion 16a. For example, an appropriate scattering layer may be formed on the mounting substrate 12, except a region for wiring. Moreover, the present embodiment employs a structure with which the emission from the semiconductor element 20 is scattered at the light scattering surface 18 without any optical effects (such as absorption or wavelength conversion) other than scattering. With such arrangements, optical loss at the light scattering surface 18 can be prevented and the light extracting efficiency can be enhanced. It is also preferable that most of the light which is emitted from the light emitting element 20 and the wavelength converting members 30 and reflected at the bottom surface and side surface of the recess portion 16a is scattered at the light scattering surface and extracted, but a part of the light reflected at the bottom surface and side surface may be extracted from the opening of the recess portion 16a without hitting the light scattering surface. Also, a fair amount of light emitted from the light emitting element 20 and the wavelength converting members 30 is emitted from the opening of the recess 16a after repeating reflections at the bottom surface and the side surface. Therefore, the light emitted from the light emitting element 20 and the wavelength converting members 30 is not necessarily directly hit the light scattering surface 18, and the effect to suppress the color unevenness can be exerted by the reflected light at the bottom surface and side surface of the recess 16a hitting the light scattering surface 18 before extracted from the opening of the recess portion 16a.

A preferable structure and arrangement of each component of the light emitting device 10 of the present embodiment will be described in detail below.

(Wavelength Converting Member 30)

In the present embodiment, the wavelength converting member 30 includes the first wavelength converting member 24 and the second wavelength converting member 26, in which the fluorescent material used in the members can be the same or different. The fluorescent material used in the first wavelength converting member 24 and the second wavelength converting member 26 is preferably of the type that is excited by near ultraviolet light or visible light. Specifically, in the case where the light emitting element 20 is a blue light emitting element and a while light emitting device is desired to be made, a fluorescent material excited by blue light and then emits broad yellow luminescence is preferably used. Examples of such fluorescent material includes a fluorescent material having garnet structure activated with cerium (particularly a fluorescent material having garnet structure that is activated with cerium and contains aluminum). A fluorescent material activated with cerium has broad emission spectrum in yellow region, and is therefore capable of producing white light of high color rendering performance when combined with blue light emission. A fluorescent material having garnet structure, particularly garnet structure containing aluminum, is durable against heat, light and moisture and can maintain the emission of yellow light with high brightness over a long period of time. As the wavelength converting material, for example, it is preferable to use a YAG-based fluorescent material (usually abbreviated to YAG) having composition of $(Re_{1-x}Sm_x)_3(Al_{1-y}Ga_y)_5O_{12}$:Ce ($0 \leq x < 1$, $0 \leq y \leq 1$, where Re is at least one element selected from the group consisting of Y, Gd, La, Lu and Tb). Color rendering performance may also be adjusted by using a fluorescent material such as $Lu_3Al_5O_{12}$:Ce, $BaMgAl_{10}O_{17}$:Eu, $BaMgAl_{10}O_{17}$:Eu, Mn, (Zn, Cd)Zn:Cu, $(Sr, Ca)_{10}(PO_4)_6Cl_2$:Eu, Mn, $(Sr, Ca)_2Si_5N_8$:Eu, $CaAlSiB_xN_{3-x}$:Eu, and $CaAlSiN_3$:Eu, in addition to the yellow fluorescent material.

In such cases, for example, the emission wavelength of the light emitting element 20 is short, the wavelength converting member 30 may contain two or more kinds of fluorescent materials. It may be such that a first fluorescent material is excited by primary light emitted from the light emitting element 20 and then emits secondary light which excites a different kind of fluorescent material to emit light. Use of two kinds of fluorescent material having different chromaticity values makes it possible to emit light with any chromaticity within a region defined by connecting the points of chromaticity of the two kinds of fluorescent material and of the semiconductor light emitting element on the chromaticity diagram.

As will be described below, the first wavelength converting member 24 and the second wavelength converting member 26 are used for different purposes in the light emitting device 10, leading to a different preferred structure.

(1) First Wavelength Converting Member 24

The first wavelength converting member 24 formed beneath and in parallel relation to the light emitting element 20 mainly serves as a substrate for wavelength converting the light emitted from the bottom surface of the light emitting element 20 and for fixing the light emitting element 20, and as a heat releasing path from the light emitting element 20 to the mounting substrate 12. Arranging the first wavelength converting member 24 beneath the light emitting element 20 enables wavelength converting the light downwardly emitted from the light emitting element 20, so that it is advantageous for suppressing the color unevenness. In the present embodiment, the light emitted from the side surfaces and the bottom of the light emitting element 20 and the light emitted from the first wavelength converting member 24 are scattered at the light scattering surface formed on the side surface 18 of the recess portion 16a and mixed, then emitted to outside.

The first wavelength converting member 24 is a composite material of an inorganic binder made of an inorganic material and a fluorescent material. Various inorganic materials can be used for the inorganic binder, such as an inorganic crystal such as sapphire, an amorphous material such as glass, and ceramics. Generally, an inorganic material such as glass and sapphire has a small difference in the refractive index with respect to that of a fluorescent material made of an inorganic material. For example, the refractive index of the fluorescent materials having a garnet structure with aluminum is in a range from about 1.7 to 1.8, but the refractive index of common light transmissive resins is about 1.5, while the refractive index of glass is about 1.6, and the refractive index of sapphire is about 1.7. Accordingly, scattering of light by the fluorescent material in the first wavelength converting member 24 is small, and thus the amount of the returning light to the light emitting element 20 can be suppressed. Also, an inorganic material has a hardness higher than that of an organic material such as a resin and a high temperature processing is also possible. Thus, disposing a wiring on the first wavelength converting member 24 using an inorganic material can be performed easily, therefore preferable for the substrate surface on which a light emitting element 20 to be mounted.

It is preferable that the first wavelength converting member 24 has a structure in which the fluorescent material and the inorganic binder are substantially uniformly mixed. For example, in the case where the structure of the first wavelength converting member 24 has an island structure in which one of the fluorescent material and the inorganic binder is dispersed in an island shape in the other, uniform wavelength conversion can be performed in the first wavelength converting member 24, and therefore, preferable. In this case, the structure may either be such that the fluorescent material is dispersed in an island shape in the inorganic binder or that the inorganic binder is dispersed in the fluorescent material in an island shape. For uniform wavelength conversion, the diameter of the islands in the sea-island structure may be set, for example, in a range from 1 μm to 50 μm.

Any light transmissive materials can be used for the inorganic binder, but the difference in the refractive index between the material and the fluorescent material is preferably 0.3 or less, more preferably 0.2 or less, further preferably 0.1 or less. The difference in the refractive index between the inorganic binder and the fluorescent material in the first wavelength converting member 24 is preferably smaller than the difference in the refractive index between the light transmissive resin and the fluorescent material in the second wavelength converting member 26. With this arrangement, the amount of the scattering in the first wavelength converting member 24 and resulting deterioration of the light extracting efficiency can be suppressed.

The material used for the inorganic binder preferably has a thermal conductivity with which the overall thermal conductivity of the first wavelength converting member 24 can be 0.8 (W/mK) or greater, more preferably 1.2 (W/mK) or greater, further preferably 35 (W/mK) or greater. Forming the first wavelength converting member 24 with such material enables to improve the durability of the first wavelength converting member 24 and at the same time improve the heat dissipation from the light emitting element 20 to the mounting substrate 12, and therefore, the light emitting device 10 with high reliability can be realized.

The first wavelength converting member 24 of the present embodiment has a plate shape so that the light emitting element 20 can be fixed stably. Also, forming the first wavelength converting member 24 in a plate shape facilitates the assembly of the light emitting device 10, because the first wavelength converting member 24 can be processed as a plate shape material with a slightly larger size and then cut it off in a desired size to fix it on the supporting substrate 32. Further, the first wavelength converting member 24 of the present embodiment also serves as a mounting surface for flip-chip mounting the light emitting element 20, and the first wavelength converting member 24 has a planar shape which facilitates disposing the wiring. For example, a wiring pattern is formed on the first wavelength converting member 24 which is processed in an oversized planar shape, and then cut it out to adhere on the support member 32. Connecting the wiring pattern on the surface of the first wavelength converting member 24 and the light emitting element 20 by a conductive member such as a metal and a resin or by an adhesive enables releasing heat from the light emitting element 20 to the first wavelength converting member 24 through the wiring pattern. Flip-chip mounting of the light emitting element 20 allows the light emitting layer 38 which is a cause of generating heat to be close to the first wavelength converting member 24, so that heat can be released efficiently.

The shape of the first wavelength converting member 24 in top view is preferably substantially a square, as is the light emitting element 20. The first wavelength converting member 24 overlaps the light emitting element 20 in top view and preferably has a larger size than the light emitting element 20. Specifically, the length of a side of the first wavelength converting member 24 may be about 1.5 to 3.5 times of the length of a side of the light emitting element 20. For example, in the case where the light emitting element 20 is substantially a square with a side of about 450 μm, the first wavelength converting member 24 may be substantially a square with a side of about 1 mm, and in the case where the light emitting element 20 is substantially a square with a side of about 1 mm, the first wavelength converting member 24 may be substantially a square with a side of about 1.5 mm. With this arrangement, the distance between the side surface from the first wavelength converting member 24 to the light scattering surface may be about 0.5 to 1.5 mm. The thickness of the first wavelength converting member 24 can be selected so as to obtain a desired chromaticity, and for example, is about 100 μm to 300 μm. The shape of the first wavelength converting member 24 in top view is not limited to a rectangular shape, and various shapes such as a circular shape, an oval shape can be employed.

Not much scattering occurs in the first wavelength converting member 24, so that the proportion of wavelength conversion of the light from the light emitting element 20 is likely lower than that of the second wavelength converting member 26. Therefore, in order to perform sufficient wavelength conversion in the first wavelength converting member 24, the first wavelength converting member 24 is preferably formed thick to some extent. For example, the first wavelength converting member 24 preferably has a thickness larger than that of the light emitting element 20. The thickness of the first wavelength converting member 24 is preferably larger than that of the second wavelength converting member 26. The thicknesses of the first wavelength converting member 24 and the second wavelength converting member 26 are determined by the thickness on the line passing through the center of the light emitting element 20 and perpendicular to the principal surface of the light emitting element 20. For the same reason, the density of the fluorescent material in the first wavelength converting member 24 is preferably higher than the density of the fluorescent material in the second wavelength converting member 26. Herein, the densities of the fluorescent materials in the first wavelength converting member 24 and in the second wavelength converting member 26 are respectively determined by the weight of the fluorescent material per unit volume.

In the present embodiment, the light emitting element 20 is directly fixed on the first wavelength converting member 24, but a light transmissive member may be arranged on first wavelength converting member 24 and the light emitting element is disposed thereon. For example, a light transmissive member having good thermal dissipation such as sapphire or glass may be arranged between the first wavelength converting member 24 and the light emitting element 20. Arranging a light transmissive member having a size in the planar direction larger than that of the first wavelength converting member 24 allows efficient extraction of the light of the light emitting element from the side surface of the light transmissive member. That is, the light of the light emitting element is extracted from the side surface of the light transmissive member and then irradiated on the light scattering surface 18 without being passed through the wavelength converting member 30. Thus, light loss by absorption while passing the wavelength converting member 30 can be reduced. Arranging the size of the light transmissive member in planar direction larger than the light transmitting element 20 enables the emission from the top and the bottom of the light transmissive member at portions projecting beyond the light emitting element 20. Whereas, the light emitted from the light transmissive member is scattered at the light scattering surface 18 formed on the side surface of the recess portion 16*a*, so that the color unevenness can also be suppressed. In order that the first wavelength converting member 24 has a "plate shape", the overall shape may be a plate shape, and that may define a recess or a hole for mounting a light emitting element. A pattern for generating an optical effect may be formed on the surface.

(2) Second Wavelength Converting Member 26

The second wavelength converting member 26 disposed on the upper portion of the light emitting element 20 serves to convert the wavelength of light which is mainly the light emitted from the light emitting element 20 and extracted outside without hitting the recess portion 16*a* of the package. Such light does not undergo a color mixing by scattering at the light scattering surface 18, so that in order to scatter the light within itself, the second wavelength converting member 26 has a structure in which a fluorescent material is dispersed in a light transmissive resin. Further, it is preferable that the second wavelength converting member 26 is formed so that the optical path length of the light emitted from the light emitting element 20 travelling through is substantially uniform. With this arrangement, a light emitting device with less color unevenness can be obtained. Specifically, a fluorescent material made of an inorganic material such as a garnet fluorescent material is dispersed in a light transmissive resin having a difference in the refractive index with that of the fluorescent material being 0.3 or greater, more preferably 0.4 or greater. A silicone resin composition, a modified silicone resin composition, or the like is preferably used as the light transmissive resin, but an insulating resin having light transmissive property such as an epoxy resin composition, a modified epoxy resin composition, or an acrylic resin composition can also be used. It is also possible to use resins having excellent weatherability, such as a hybrid resin containing at least one kind of these resins. The second wavelength converting member 26 preferably covers the top surface and the side surfaces of the light emitting element 20 with a substantially uniform thickness. The second wavelength converting member 26, in which a fluorescent material is dispersed in a light transmissive resin, can cover the top surface and the side surfaces of the light emitting element 20 easily with a substantially uniform thickness by way of potting or the like.

On the other hand, it is preferable that the second wavelength converting member 26 is formed so as not to cover the side surfaces of the first wavelength converting member 24. With this arrangement, light can be extracted efficiently from the side surfaces of the first wavelength converting member 24. For the same reason, it is preferable that the second wavelength converting member 26 covers the upper portion of the first wavelength converting member 24 such that it covers the portion near the light emitting element 20 but it does not cover the portions near the outer periphery of the first wavelength converting member 24.

The top surface of the second wavelength converting member 26 is preferably formed in a curved surface. With this arrangement, the total internal reflection of light within the second wavelength converting member 26 can be prevented and the light extracting efficiency can be improved. Smooth curved surface of the top surface of the second wavelength converting member 26 can be obtained by way of potting or the like.

A pattern to obtain an optical effect such as a lens pattern may be disposed on the light receiving surface and the light emitting surface of the first wavelength converting member 24 and the second wavelength converting member 26 respectively. As described above, the first wavelength converting member 24 of the present embodiment has a plate shape, but a pattern may be disposed on the surface as long as the overall shape remains a plate shape. Also, even in a case where a pattern is provided on the fixing surface of the light emitting element, the light emitting element can be fixed stably if the period of the pattern is sufficiently smaller than the size of the light emitting element.

(Arrangement of Light Emitting Element 20 and Wavelength Converting Member 30)

In the present embodiment, uniform irradiation with the emission from the light emitting element 20 and the emission from the wavelength converting member 30 onto a wide area of the light scattering surface 18 at the recess portion is advantageous for obtaining preferable mixing of light color at the light scattering surface 18. For this, both the light emitting layer 38 of the light emitting element 20 and the wavelength converting member 30 are preferably spaced apart from the side surface and the bottom surface of the recess portion 16*a*. Further, in the case where both the light emitting layer 38 and the wavelength converting member 30 are spaced apart from the side surface and the bottom surface of the recess 16*a*, the proportion of light scattered or reflected being returning to the light emitting element 20 and the wavelength converting member 30 can be reduced, so that the light extracting efficiency can also be improved.

Figure 3:
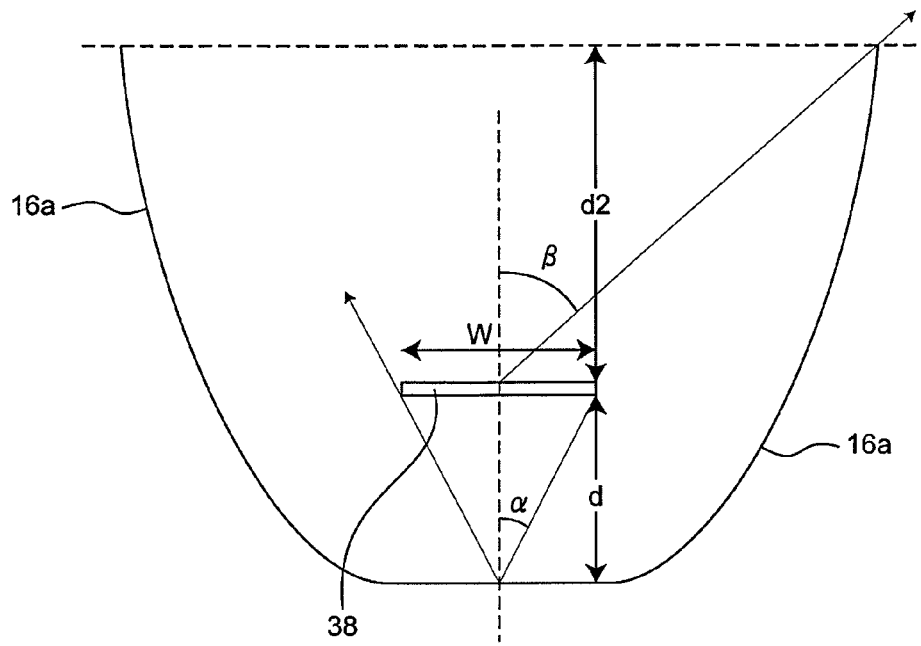
FIG. 3 is a schematic view illustrating a relationship between the recess portion and the light emitting layer.

For example, in the present embodiment, as shown in FIG. 3, the light emitting layer 38 is disposed so that with the greatest width w (μm) of the light emitting layer 38 in the planar direction, the distance d from the light emitting layer 38 of the light emitting element 30 to the bottom surface of the recess portion 16*a* is at least 0.5 w (μm). According to the structure of the package 16, the bottom surface of the recess portion 16*a* may have a stacked layer structure, and in such a case, with the surface showing the strongest reflection of the light from the light emitting layer 38 as a standard surface, the distance d is indicated the distance from the surface to the light emitting layer 38. In the case where the distance from the light emitting layer 38 to the surface of the recess portion 16*a* at where the light to be reflected is too small, such as a case where the light emitting element 20 is directly fixed on the bottom surface of the recess portion 16*a*, most of the light emitted from the light emitting layer 38 returns to the light emitting element 20 and re-absorbed by the semiconductor layer or the electrode in the light emitting element 20. In the case of light emitted from the ends of the light emitting layer 38 and reflected at the bottom surface of the recess portion 16*a*, with the distance d from the light emitting layer 38 to the bottom surface of the recess portion 16*a* being 0.5 w or greater, among the light downwardly emitted from the ends of the light emitting layer 38, the light incident to the bottom surface of the recess portion 16*a* at an incident angle α (the angle of the normal line to the bottom surface of the recess 16*a* and the light incident to the bottom surface) of 45° or greater can be extracted to the outside. Therefore, with the distance d from the light emitting layer 38 to the bottom surface of the recess portion 16*a* being 0.5 w or greater, the amount of light downwardly emitted from the light emitting layer 38 and emitted outside without returning to the light emitting element 20 can be increased. A critical value of the incident angle α decreases as the distance d from the light emitting layer to the bottom surface of the recess portion 16*a* increases, and the amount of light extracted to outside increases. The distance d from the light emitting layer 38 to the bottom surface of the recess portion 16a is preferably 1 w (μm) or greater, more preferably 2 w (μm) or greater. The light emitting layer 38 is preferably disposed at a location higher than one-third of the depth (distance from the bottom surface to the top surface of the recess portion) of the recess portion 16a. As described above, arranging the light emitting layer 38 in the light emitting element 20 sufficiently spaced apart from the bottom surface of the recess portion 16a decreases the probability of the light downwardly emitted from the light emitting layer 38 reflected at the bottom surface of the recess portion 16a and returning to the light emitting element 20, so that the emission of the light emitting element 20 can be used efficiently. It is preferable that the greater the distance d from the light emitting layer 38 to the bottom surface of the recess portion 16a, the wider the area irradiated with the light downwardly emitted from the light emitting layer 38. In the same manner, the distance from the wavelength converting member 30 to the bottom surface of the recess portion 16a is desirably such that with the greatest width w' of the wavelength converting member 30, the distance is 0.5 w' or greater, preferably 1 w' or greater.

Also, in a plane including the light emitting layer 38 of the light emitting element 20 and in parallel to the light emitting element 20, the light emitting layer 38 is preferably arranged so that with the greatest width w (μm) of the light emitting layer 38 in the planar direction, the shortest distance from the end of the light emitting layer 38 to the side surface of the recess 16a is preferably 0.5 w (μm) or greater, 1 w (μm) or greater, more preferably 1 w (μm) or greater. With this arrangement, light emitted in lateral direction from the light emitting layer 38 can be irradiated over a wider area of the light scattering surface. Further, the proportion of light scattered at the light scattering surface of the recess portion 16a returning to the light emitting element 20 can also be reduced. In the same manner, in a plane including the wavelength converting member 30 and in parallel to the wavelength converting member 30, the shortest distance from the wavelength converting member 30 to the side surface of the recess portion 16a on which the light scattering surface to be formed is 0.5 w' or greater, preferably 1 w' or greater. Herein, the distance described above is considered the shortest distance from an end of light emitting element 20 or the wavelength converting member 30 to a side surface of the recess portion. In the case where a plurality of wavelength converting members 30 are employed, the distant relationship described above is applied respectively.

In order to preferably mix the emission of the light emitting element 20 and the emission of the wavelength converting member 30 by using the light scattering surface 18, the relative positional relationship among the light emitting element 20, the wavelength converting member 30, and the light scattering surface 18 is needed to be considered. In order to improve the mixing of color so as to suppress the color unevenness, the distance between the wavelength converting member 30 and the light emitting element 20 is preferably smaller than the distance between the wavelength converting member 30 and the light scattering surface 18. This is because that in the case where the wavelength converting member 30 is spaced apart from the light emitting element 20 and is too close to the light scattering surface 18, the amount of light emitted from the light emitting element 20 reaching the light scattering surface without passing through the wavelength converting member 30 increases and the light emitted from the wavelength converting member 30 is difficult to be irradiated uniformly on the light scattering surface 18. Therefore, at least the main part of the wavelength converting member preferably satisfies the relationship described above. Further, due to large color unevenness in the light emitted laterally from the light emitting element 20 and the wavelength converting member 30, the dividing distances from the light emitting element 20 and the wavelength converting member 30 to the respective light scattering surface 18 located lateral to each of them are arranged larger than the dividing distances from the light emitting element 20 and the wavelength converting member 30 to the bottom surface of the recess portion 16a.

In the light emitting device 10 of the present embodiment, mixing of light caused by scattering dues not occur in the light which is not incident to the side surface of the recess portion 16a of the package among the light emitted from the light emitting element 20 and the wavelength converting member 30. The light emitted from the top surface of the light emitting element 20 in a direction vertical to the top surface of the recess portion 16a is extracted directly to the outside without being incident on the side surface of the recess portion 16a. For example, as shown in FIG. 4, in the case where the top surface of the light emitting element 20 is in parallel to the top surface of the recess portion 16a, the light emitted from the top surface of the light emitting element 20 in normal direction is extracted directly to the outside without being incident on the light scattering surface 18 of the recess portion 16a. Therefore, in the present embodiment, the second wavelength converting member 26 is formed at the top surface side of the light emitting element 20 so that the light which is emitted from the top surface of the light emitting element 20 and extracted to the outside without being incident on the surface of the recess portion 16a passes through the second wavelength converting member 26. With this arrangement, the light passed through the second wavelength converting member 26 and the light scattered at the light scattering surface 18 are extracted from the opening at the top surface of the recess portion 16a, which constitute the emission of the light emitting device. The second wavelength converting member 26 can be disposed after the light emitting element 20 is disposed so as to cover the light emitting element 20, so that it is relatively easy to form the shape of the second wavelength converting member 26 in conformity with the contour of the light emitting element 20. In the case where the second wavelength converting member 26 covering the top surface of the light emitting element 20 is not provided, the light emitted from the light emitting element 20 which is not directly incident on the surface defining the recess portion 16a may be returned to the recess portion 16a by an appropriate reflector plate or the like.

It is also difficult to obtain a completely uniform length of light path of the light emitted from the light emitting element 20 and passing through the second wavelength converting member 26. Specifically, the light obliquely passing through the second wavelength converting member 26 tends to cause color unevenness. Therefore, it is favorable for suppressing the color unevenness that the light emitted from the light emitting element 20 is not directly extracted to the outside but is scattered as much as possible at the light scattering surface 18. The proportion of the light directly extracted to the outside without being reflected at the recess portion 16a of the package among the light emitted from the light emitting element 20 and the wavelength converting member 30 also changes according to the location of the light emitting layer 38 in the recess portion 16a. The proportion of light extracted to the outside without being incident on the side surface of the recess portion 16a can be reduced by arranging the light emitting layer 38 spaced apart from the top surface of the recess portion 16a, so that the effect of color mixing caused by scattering at the light scattering surface 18 can be increased. In the case where the light laterally emitted from the light emitting element 20 is scattered at the light scattering surface 18 and extracted through the opening at the top surface of the recess portion 16a, it is preferable that the light emitting element 20 is spaced apart from the top of the recess portion 16a so that the scattered light can be dispersed sufficiently before extracted. With the greatest width w (μm) of the light emitting layer 38 in the planar direction, the light emitting layer 38 is preferably arranged so that the distance $d_2$ from the light emitting layer 38 of the light emitting element 20 to the top surface of the recess portion 16a is at least 0.5 w (μm), more preferably 1 w (μm) or greater. In order to scatter most of the light from the light emitting layer 38 at the light scattering surface 18, the distance $d_2$ is preferably set as the same or greater than the distance d. In the present specification, the term "top surface" of the recess portion 16a indicates the plain which includes the top edge defining the recess portion 16a. In the case where a sealing member is filled in the recess portion 16a with the top surface of the sealing member being closer to the light emitting element 20 rather than to the plane including the top edge defining the recess portion 16a, reflection of light occurs at the interface between the sealing member and the air. Therefore, the location of each member is desirably determined with the top surface of the sealing member as the "top surface" of the recess portion 16a. Specifically, in the case where the top surface of the sealing member is approximately plane, the determination described above is preferably employed. The indication of the "top surface" is applied in the same manner in other embodiments.

Further, as shown in FIG. 3, with β indicating the angle between the line passing the center of the light emitting layer 38 and a top edge defining the recess portion 16a and the optical axis (direction of the optical axis in the case where the recess portion serves as a reflective mirror without having scattering property) of the recess portion 16a, all the light which is upwardly emitted from the canter of the light emitting layer 38 and which has an angle with respect to the optical axis of the recess portion 16a being less than β will reach the top plane of the recess portion 16a without being reflected at the recess portion 16a of the package. Therefore, it is preferable to arrange the relationship between the recess portion 16a and the light emitting layer 38 to obtain a small angle β which enables to enhance the effect caused by the scattering at the surface defining the recess portion 16a. The angle β is preferably 90° or smaller, and more preferably 70° or smaller. On the other hand, if the angle β is too small, the resulting light emitting device exhibits strong directivity which may be undesirable for some applications. Also, if the angle β is too small, the emitted light from the light emitting element 20 repeats scattering at the surface defining the recess portion 16a which increases the amount of the light returning to the light emitting element 20, and thus the optical output of the light emitting device 10 decreases. Therefore, the angle β is preferably 30° or greater, more preferably 50° or greater. The angle β can be adjusted by the distance $d_2$.

The longer the distance $d_2$ is, the smaller the angle β is. The angle β can also be adjusted by increasing or decreasing the width of the opening of the recess portion 16a which is the light emitting portion. The smaller the width of the opening is, the smaller the angle β is.

In the case where a sealing member is filled in the recess portion 16a, among the light reached the top surface of the recess portion 16a, the light incident on the top surface of the recess portion 16a at an angle equal or smaller than the critical angle $θ_c$ for total internal reflection is directly extracted to the outside and the light incident on the top surface of the recess portion 16a at an angle larger than the critical angle $θ_c$ is totally reflected and returned into the recess portion 16a. Therefore, in the case where the critical angle $θ_c$ is smaller than the angle β, the amount of light which is directly extracted can be reduced and the light returned in the recess portion 16a by the total internal reflection can be scattered at the light scattering surface, so that the color unevenness can be further improved. Forming the top surface of the sealing member in an approximately flat surface configuration enables to increase the total internal reflection on the surface of the sealing member. On the other hand, in the case where the critical angle $θ_c$ is larger than the angle β, the proportion of the light which is directly extracted increases, but it is preferable in view of the light extracting efficiency. Further, the surface reflection at the sealing member can be reduced and the light extracting efficiency can be increased by forming the sealing member in a shape which is protruding from the recess portion 16a so that the top surface of the sealing member has an outwardly curving surface.

(Supporting Member 32)

In the present embodiment, the light emitting element 20 is bonded to the mounting substrate 12 through the first wavelength converting member 24 and the supporting member 32 so that the light emitting layer 38 of the light emitting element 20 is spaced apart at a predetermined distance from the bottom surface of the recess portion 16a of the package. The supporting member 32 of the present embodiment is light transmissive to the emission of the light emitting layer 38 so that the light emitted downwardly from the light emitting layer 38 can be used efficiently. Further, the supporting member 32 forms, with the first wavelength converting member 24, a heat dissipation path from the light emitting element 20 to the mounting substrate 12, so that the supporting member 32 is preferably made of a material having high heat conductivity. The supporting member 32 is preferably made of a material having a heat conductivity of 0.8 W/mK or more, preferably 1.2 W/mK or more, and more preferably 35 W/mK or more. For example, an inorganic material such as sapphire or glass can be used for the supporting member 32. Among those, sapphire is preferable because it has a relatively high heat conductivity and a high transmissivity to the blue light emitted from the light emitting element 20. Further, it is preferable that the supporting member 32 does not contain any particles, including a fluorescent material, which scatters light. It is necessary that at least the scattering in the supporting member 32 is weaker than the scattering in the first and second wavelength converting members 24, 26. Moreover, the first wavelength converting member 24 is disposed on the supporting member 32 so that the first wavelength converting member 24 is spaced apart from the bottom surface of the recess portion 16a. Therefore, a light transmissive substrate is preferably used as the supporting member 32.

The members, including the supporting member 32, interposed between the light emitting element 20 and the mounting substrate 12 serve as a heat dissipation path from the light emitting element 20 toward the mounting substrate 12, so that they are preferably made of materials having high heat conductivity. For example, in the present embodiment, both the first wavelength converting member 24 and the supporting member 32 are preferably made of materials having high heat conductivity. It is preferable that the main material of the supporting member 32 has a heat conductivity of 0.8 (W/mK) or more, preferably 1.2 (W/mK) or more, and more preferably 35 (W/mK) or more. With this arrangement, the heat dissipating efficiency of the light emitting element 20 can be enhanced, thus is realized a light emitting device 10 in which only a small decrease in its optical output power occurs even after a long-time operation. A member having low heat conductivity may be provided between the light emitting element 20 and the bottom surface of the recess portion 16*a*, as a thin film so as not to disturb the overall heat transfer. For example, the first wavelength converting member 24 and the supporting member 32 each having high heat conductivity may be bonded by an adhesion layer having low heat conductivity to the extent that the overall heat conduction is in the range described above. In view of heat dissipation, as shown in FIG. 1, the supporting member 32 is preferably arranged so that it is in contact with at least one of the wirings 12*a* and 12*b*. Also, a heat dissipater such as a metal member which is insulated from the wirings may be provided and the supporting member 32 is disposed on the heat dissipater. The supporting member 32 and the wirings 12*a*, 12*b* are bonded by a resin material, a metal paste, or the like. A metal paste having high heat conductivity is preferably used. In such case, a metal film is formed on the surface of the supporting member 32 and a metal paste is applied to the metal film side for bonding. Thus, adhesion can be improved. The metal film can be used as a reflecting layer.

Further, the members inclusive of the supporting member 32, interposed between the light emitting element 20 and the recess portion 16*a*, are preferably light transmissive so as not to absorb the emission of the light emitting element 20. A member having low heat conductivity may be provided between the light emitting element 20 and the bottom surface of the recess portion 16*a*, as a thin film so as not to disturb the overall heat transfer. For example, the light transmissive first wavelength converting member 24 and the light transmissive supporting member 32 may be bonded with an adhesive layer with low light transmissiveness, as long as the overall light transmissiveness of the members supporting the light emitting element 20 is not decreased. In the case where such a member having low light transmissivity is interposed between the light emitting element 20 and the bottom surface of the recess portion 16*a*, the member having low light transmissivity is preferably disposed with a smaller width than the first wavelength converting member 24, and further preferably with a smaller width than the light emitting layer 38 so as to reduce the blocking of the light emitted from the light emitting layer 38 toward the bottom surface of the recess portion 16*a*. In the case where a light-reflecting member having larger area than the light emitting element 20 is disposed between the light emitting element 20 and the bottom surface of the recess portion 16*a*, the arrangement of the light emitting layer 38, the first wavelength converting member 24, and the like are preferably adjusted as the bottom surface of the recess portion is substantially the light-reflecting member.

The supporting member 32 and the first wavelength converting member 24 are preferably stacked in this order on the bottom surface of the recess portion 16*a*, so that the first wavelength converting member 24 can be spaced apart from the bottom surface of the recess portion 16*a*. Spacing the first wavelength converting member 24 apart from the bottom surface and the side surface of the recess portion 16*a* facilitates irradiation from the first wavelength converting member 24 on a wider area of the light scattering surface. Also, the proportion of light scattered or reflected at the recess portion 16*a* returning the first wavelength converting member 24 can be reduced. Further, although the support member 32 is light transmissive, a part of light is confined by total internal reflection at the interface between the supporting member 32 and the members surrounding it. Therefore, it is desirable that the supporting member 32 is disposed with a width sufficient to support the first wavelength member 24 so that the downwardly emitted light from the first wavelength converting member 24 can reach the light scattering surface 18 directly. The width of the supporting member 32 is preferably approximately the same or smaller than the width of the first wavelength converting member 24, and desirably a half or greater than the width of the first wavelength converting member.

(Light Emitting Element 20)

It is sufficient that the light emitting element 20 has a light emitting layer made of a semiconductor. Particularly, an intense emission in the short wavelength region of the visible light or in the near ultraviolet region can be obtained by a light emitting element having a light emitting layer made of a nitride semiconductor, especially a light emitting layer made of a gallium nitride-based compound semiconductor (particularly InGaN). Therefore, it can be advantageously used in combination with the wavelength converting member. The light emitting element 20 preferably has an emission spectrum having an emission peak wavelength of the light emitted from the light emitting layer 38 in a short wavelength range from the near ultraviolet to visible light of about 240 nm to 500 nm, preferably 380 nm to 420 nm, further preferably 450 to 470 nm. A light emitting element which emits light in this wavelength range is capable of emitting light of a desired color, particularly white light by combination with various wavelength converting member. The light emitting element 20 having a light emitting layer made of a ZnSe-based, InGaAs-based or AlInGaP-based semiconductor may also be used.

FIG. 2 is a schematic cross sectional view showing an example of the light emitting element 20. A semiconductor layer 36 of a first conductive type (for example, n-type), a light emitting layer 38, and a semiconductor layer 40 of a second conductive type (for example, p-type) are stacked in this order on a substrate 34 which is a light transmissive and electrically insulative, such as sapphire. The second conductive type semiconductor layer 40 and the light emitting layer 38 are partially removed to expose the first conductive type semiconductor layer 36, and a first electrode (b-side electrode) 42 is disposed on the exposed surface. Also, a second electrode (p-side ohmic electrode) 44 is disposed on the approximately entire surface of the semiconductor layer 40 of the second conductivity type, and a pad electrode (p-side pad electrode) 46 for connecting to outside is further disposed on the second electrode 44. Each electrode may be either light transmissive or reflective, and generally, a light transmissive electrode is used in the case where mounting is carried out with the electrode forming surface being upper side and a reflective electrode is used in the case where the light emitting element 20 is mounted by flip-chip bonding with the electrode forming surface being downside as shown in FIG. 1.

As shown in FIG. 1, in the present embodiment, the light emitting element 20 is mounted by flip-chip bonding on the first wavelength converting member 24 with the substrate 34 of the light emitting element 20 being the upper side. Electrodes for mounting are formed on the top surface of the first wavelength converting member 24 and are connected respectively with the first electrode 42 or the second electrode 46 of the light emitting element 20 through solder bumps and the like. The electrodes formed on the top surface of the first wavelength converting member 42 are further connected respectively to the wirings 12*a*, 12*b* on the mounting substrate 12. With this arrangement, the light emitting element 20 can be driven from outside. A member capable of substantially blocking the light from the light emitting layer 38 is generally used for the electrode formed on the first wavelength converting member 24. For this reason, the electrode on the top surface of the first wavelength converting member 24 is provided only a part of the top surface of the first wavelength converting member 24 so that light travelling downwardly from the light emitting element 20 can reach the bottom surface of the recess portion 16a. It is preferable that the electrode portion projecting beyond the light emitting element 20 in top view has a width smaller than the width of the light emitting element 20.

The semiconductor light emitting element 20 that can be used in the present invention is not limited to one that has the structure shown in FIG. 2. For example, insulating, semi-insulating or reverse conductivity type structure may be provided in a part of the layer of each conductivity type. The substrate 34 may also be electrically conductive, in which case the first electrode 42 may be formed on the back surface of the substrate 34.

The substrate 34 may be either the substrate used to grow the semiconductor layer or may be attached after growing the semiconductor layer. Removing the substrate, the semiconductor layer alone can be used as a light emitting element. The shape of the light emitting element 20 in top view is typically a rectangle, and preferably a substantially square. With a substantially square shape as described above, the distances from the sides of the light emitting element 20 to the light scattering surface can be set to be substantially equal, thus suppression of color unevenness can be facilitated. It is preferable that the shape of the wavelength converting member 24 in top view is substantially the same as that of the light emitting element 20. The light emitting element 20 with a side of about several hundred μm to several mm, more specifically, a substantially square element with a side of about 400 μm to 1 mm can be used. In this case, the distance from the side surface of the light emitting element 20 to the light scattering surface 18 is, for example, about 0.5 to 2 mm.

(Package 16, Recess Portion 16a)

The package 16 may have any structure as long as it defines a recess portion 16a with a part of the inner surface being a light scattering surface, and is capable of housing the light emitting element 20 and the wavelength converting member 30 so that an electric connection to the light emitting element 20 can be made. In the present embodiment, the package 16 is constructed of a mounting substrate 12 which is a plate shape insulating member having wirings 12a, 12b disposed thereon, and an annular side wall 14 formed on the mounting substrate 12. In top view, the package 16 has a rectangular external shape and a circular cut is performed to form a circular inner side wall 14. The recess portion 16a is defined by the top surface and the inner surface of the side wall 14 of the mounting substrate 12. In the present embodiment, the side wall 14 is made of a light transmissive mother material and the side surface of the recess portion 16a is formed as a light scattering surface 18 by dispersing light transmissive particles 17 having a refractive index different from the refractive index of the mother material in the mother material.

Figure 5:
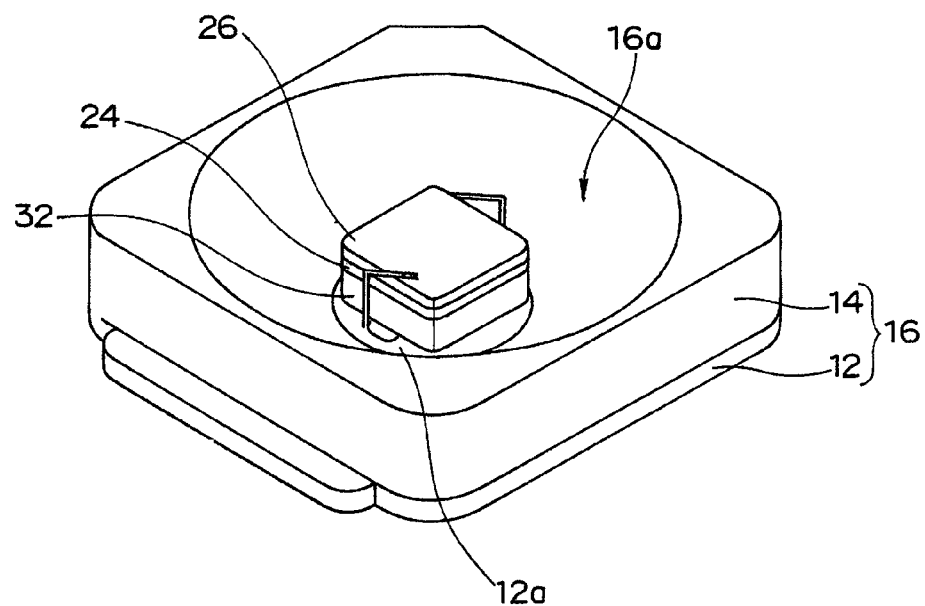
FIG. 5 is a schematic perspective view showing an example of light emitting device according to the first embodiment of the present invention.

The recess portion 16a can be of any shape as long as it is capable of containing the light emitting element 20 and the wavelength converting member 30 and the top is open to extract light. But, the bottom surface of the recess portion 16a is preferably flat so that the light emitting element 20 and the like are stably fixed. Further, it is preferable that the inner diameter of the recess portion 16a increases from the bottom upward. Also, the inner wall defining the recess portion 16a preferably has a circular cross section in plan view, so that uniformity of emission can be enhanced and the color unevenness can be suppressed. An example of the above will be shown in FIG. 5 and FIG. 6. FIG. 5 and FIG. 6 are respectively a schematic perspective view and a schematic top view showing an example of light emitting device of the present embodiment. Particularly, in the case where the light source inclusive of the light emitting element 20 and the wavelength converting member 30 has a rectangular shape in plan view, an intensity difference occurs between the light emitted from the sides of the rectangular shape and the light emitted from the corners of the rectangular shape, but by scattering such emissions at the circular inner contour of the recess portion 16a, the color unevenness due to the shape of the light source can be suppressed. Further, the shape defining the recess portion 16a is preferably a mortar shape with a circular cross-sectional shape in plan view at any height. The shape defining the recess portion 16a in plan view may have a rectangular shape which is the same planar shape but different size as that of the light emitting element 20. The light source which includes the light emitting element 20 and the wavelength converting member 30 is preferably disposed at the center of the recess portion 16a in plan view. Also, as shown in FIG. 6, in top view, it is preferable that the light scattering surface 18 on the side surface of the recess portion 16a is disposed at a location outer side than the light emitting element 20 and the wavelength converting member 30 and can be observed. Particularly, it is preferable that, in top view, the light emitting element 20 and the wavelength converting member 30 are disposed within the bottom surface area of the recess portion 16a.

The light scattering surface 18 formed on the inner surface of the recess portion 16a is capable of scattering emission of the light emitting element 20 and the emission of the wavelength converting member 30. The surface capable of scattering light may be obtained by distributing a material having a minute structure with a size approximately the same or smaller than the emission wavelength of either the light emitting element 20 or the wavelength converting member 30, which is shorter wavelength, and having a refractive index different from its surrounding.

For example, as in the side wall 14 of the present embodiment, the light scattering surface 18 can be formed by dispersing light transmissive particles having a refractive index different from that of the mother material in the light transmissive mother material. The difference in the refractive index between the particles and the surrounding materials is preferably 0.1 or greater, more preferably 1.0 or greater. As for the particles, inorganic-based particles such as glass fiber, glass beads, talk, silica, alumina, magnesia, zinc oxide, calcium carbonate, barium sulfate, titania, aluminum hydroxide, mica, feldspar powder, quartz powder, or the like, organic-based particles such as silicone resin, fluororesin, epoxy resin, styrene-based cross-linked resin, or the like, can be used as single or in combination of two or more. For the particles 17, an oxide containing one of Ti, Zr, Nb, Al and Si, and AlN, MgF, and the like, are preferable ($TiO_2$, $ZrO_2$, $Nb_2O_5$, and $Al_2O_3$ are preferable as the oxide containing Ti, Zr, Nb, Al or Si). Among those, an oxide containing one of Ti, Zr, Nb, and Al, particularly, $TiO_2$ is preferable. The particles 17 made of a material described above have a large refractive index and the refractive index with respect to the mother material can be increased, so that a stronger scattering can be obtained and thus preferable. In any of those oxides described above do not present absorption in the visible light range, and do not contribute to the decrease in the efficiency and thus preferable.

For obtaining efficient light scattering, it is preferable that the average particle size R of the particles satisfies the inequation $0.4 \times \lambda/\pi < R < \lambda$, with the emission wavelength of the light emitting element 20 as $\lambda$. The scattering is in Rayleigh scattering region with the average particle size of $0.4 \times \lambda/\pi$ or smaller and the scattering intensity increases proportional to the fourth power of the wavelength. Therefore, the scattering of the light emitted from the fluorescent material which has a longer wavelength becomes weak. Thus, it is preferable that the average particle size R of the particles is 70 nm or greater, more preferably 200 nm or greater, and 400 nm or smaller, more preferably 300 nm or smaller.

The mother material which contains the particles 17 is preferably made of a silicone resin, an epoxy resin, glass, or the like. Among those, a silicone resin has thermosetting, light resistant, and relatively flexible properties. Silicone resin has a low refractive index of about 1.4, so that a sufficient difference in refractive index with respect to the particles such as $TiO_2$ (refractive index of about 2.5) can be easily obtained and therefore the scattering at the light scattering surface 18 can be enhanced, and is thus preferable.

The particles 17 are preferably contained to a degree that can be observed as a white color, and with this, the light scattering surface 18 having a low light transmissiveness and a high reflectivity can be formed, and thus the efficiency of light extraction at the opening of the recess portion 16a can be improved. Also, the scattering coefficient of the light scattering surface can be adjusted by the amount of the particles contained. For example, the amount of the particle can be 10 to 50 weight percent of the whole light scattering surface, and particularly, in the case where $TiO_2$ particles are contained, 20 to 40 weight percent of the whole is desirable. It is preferable that with the particles contained in an amount of 30 weight percent or greater, the scattering is enhanced while increasing the reflectivity at the light scattering surface 18.

The light scattering surface 18 on the surface defining the recess portion 16a may be formed by using a different method. For example, the inner surface of the side wall 14 can be made as a light scattering surface by forming the side wall 14 using a porous body formed by aggregation and sintering of particles. The side wall 14 may be formed by using a porous body obtained by using a sol-gel method. At such a porous body, light scattering occurs due to the difference in the refractive index between the material of the porous body and the air (or a material having a different refractive index filled in the holes) at the holes of the porous body. In the case where such a porous body is used for the side wall 14, a composite material of a porous body and a resin may be used to increase the sealing property and the airtightness. The light scattering surface can also be obtained by performing a treatment for forming unevenness or roughness, or disposing a layer of light scattering particles on the surface of the light transmissive member or the reflective member.

Forming the light scattering surface 18 also on the bottom surface of the recess portion 16a enables to scatter light at wider area and extract the light from the opening of the recess portion 16a. On the other hand, the bottom surface of the recess portion 16a may be formed to produce smaller scattering than the light scattering surface 18, and in such a case, a light-reflecting member is preferably disposed at the bottom surface of the recess portion 16a. With this arrangement, light from the light source reaching the bottom surface of the recess portion 16a can be reflected and then extracted. Further, providing an arrangement that enables a part of the reflected light reaching the light scattering surface 18 on the side surface of the recess portion 16a enables light emitted downwardly from the light source to be scattered at the light scattering surface 18 and to be extracted.

In the case where the light scattering surface 18 is provided on the side surface of the recess portion 16a, the light scattering surface 18 is preferably formed so as to uniformly enclose the light emitting element 20. That is, in plan view, the light scattering surface 18 is preferably formed uniformly in all the directions around the center of the light emitting element 20. This is because, in the case where the light scattering surface 18 is formed widely only in one direction or is formed except for one direction, with respect to the center of the light emitting element 20, color unevenness may result. Making the above-described angle β smaller, more specifically, making the above-described distance $d_2$ greater than the distance d, or making the width of the opening of the recess portion 16a smaller, the proportion of the light scattering region in the total luminous flux including the light emitting element 20 and the wavelength converting member 30 can be enlarged. The proportion of the light scattering region can be increased also by increasing the distance between the light source and the light scattering surface 18, so that the distance between the light source and the light scattering surface 18 is preferably about the same or greater than the distance d. In the case where the bottom surface of the recess portion 16a is not made as a light scattering surface, the bottom surface is preferably made smaller, in plan view, the greatest width of the bottom surface is preferably made about 1 to 1.2 times of the maximum width of the light source. Also, as shown in FIG. 6, in order to efficiently extract light emitted on the light scattering surface, in top view, it is preferable that the light scattering surface 18 formed on the side surface of the recess portion 16a is arranged at a location outer side than the light emitting element 20 and the wavelength converting member 30 so that the light scattering surface 18 can be observed.

In the specification, the term "bottom surface" of the recess portion 16a means among the regions defining the recess portion 16a, a region including the projected area of the light emitting element 20 in the optical axis direction and locating at the same height or lower than the projected area, and the term "side surface" of the recess portion 16a means the regions rising above the "bottom surface". The descriptions of "bottom surface" and "side surface" will be applied in the same manner to the recess portions 16a in other embodiments.

(Mounting Substrate 12)

The mounting substrate 12 is sufficient to have a wiring formed on its surface for electrical connection with the semiconductor light emitting element 20. In the present embodiment, the mounting substrate 12 is formed with an insulating member having a flat plate shape and a wiring formed on the insulating member. Ceramic such as aluminum nitride or alumina, or glass can be used as the insulating member. Otherwise, the mounting substrate 12 may be such that an insulating thin film layer such as aluminum nitride is formed on a surface of a semi-metal such as Si or a metal. Those mounting substrates 12 are preferable because of their high heat dissipation. The wiring may be formed by subjecting a metal layer to patterning using an ion milling method or an etching method. For example, the wiring pattern made of a thin film of platinum or the like may be formed on the surface of aluminum nitride. Further, a protective film made of a thin film such as $SiO_2$ may be formed for the purpose of protecting the wiring pattern. In addition, a heat dissipating body such as a metal member which is insulated from the wiring of the mounting substrate may be disposed on the region where the supporting member to be disposed.

(Sealing Member 28)

The material of the sealing member 28 filled in the recess portion 16a is not specifically limited as long as it has a light transmissive property. A silicone resin composition, a modified silicone resin composition, or the like is preferably used in view of durability, but a light transmissive insulating resin composition such as an epoxy resin composition, a modified epoxy resin composition, or an acrylic resin composition can also be used. A sealing member having excellent weather resistance such as a hybrid resin containing at least one kind of these resins can also be used. Further, an inorganic material having excellent light resistance such as glass or silica gel can also be used. The sealing member is preferably a member having a light transmissivity of the light from the light emitting element 20 and the wavelength converting member 30 higher than that of the wavelength converting member 30, and having a content of a fluorescent material smaller than that of the wavelength converting member 30, and is further preferably a light transmissive member that does not contain a fluorescent material. In addition, a light scattering agent that is capable of scattering light is preferably not contained. The top surface of the sealing member 28 is preferably approximately flat and also approximately in parallel with the first wavelength converting member 24. With this arrangement, light obliquely emitted from the principal surface and side surfaces of the first wavelength converting member 24 having a plate shape can easily enter the sealing member 28 at a high angle, so that the light can be facilitated to return to the recess portion 16a to be scattered. Also, lens effect can be obtained by forming the light emitting surface side of the sealing member 28 in a predetermined shape. The size of the lens can be selected smaller or larger than the top surface defining the recess portion 16a, and a grove can be provided on the surface of the lens to control the distribution of the light.

Figure 7:
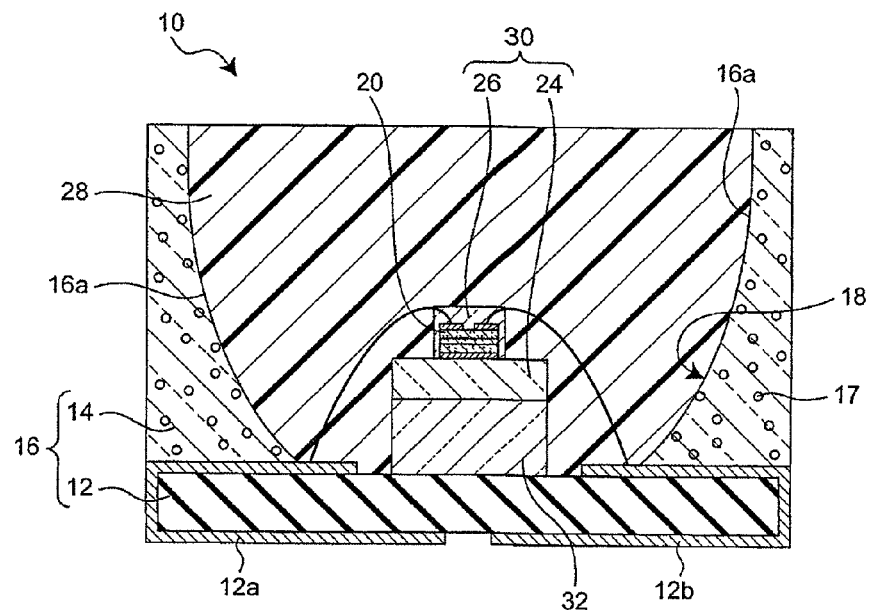
FIG. 7 is a schematic sectional view showing a light emitting device according to the second embodiment of the present invention.

FIG. 7 is a schematic cross-sectional view showing a light emitting device according to the second embodiment of the present invention. In the present embodiment, the light emitting element 20 is mounted on the first wavelength converting member in a face-up manner, and the second wavelength converting member is provided around the light emitting element. This embodiment is similar to the first embodiment in other respects. The wavelength converting member can be formed, for example, by printing a resin containing a fluorescent material.

The light emitting element 20 has a structure, for example as shown in FIG. 2, and is fixed over the first wavelength converting member 24 with the substrate 34 at the down side. The light emitting element 20 preferably has a light transmissive substrate 34 such as sapphire so that downward emission from the light emitting layer 38 can be efficiently used. Further, a light transmissive adhesive is preferably used to fix the light emitting element 20 over the first wavelength converting member 24. For example, silicone or the like can be used. The first electrode 42 and the second electrode 46 formed on the top surface of the light emitting element 20 are respectively connected with the wiring 12a and 12b of the mounting substrate through the wires.

As described above, with the light emitting element 20 mounted in a face-up manner, re-entering of light into the light emitting element 20 can be prevented. Further, wiring on the first wavelength converting member 24 is no longer needed, so that manufacturing can be simplified.

Also in the present embodiment, the second wavelength converting member 26 is disposed approximately uniformly along the outer periphery of the light emitting element 20. Therefore, color unevenness can be suppressed efficiently in the emission extracted outside without being scattered at the surface defining the recess portion 16a. Further, the top surface of the first wavelength converting member 24 is formed wider than the second wavelength converting member 26. With this arrangement, a part of the top surface of the first wavelength converting member 24 is exposed outside of the second wavelength converting member 26, so that light can also be directly extracted from the top surface of the second wavelength converting member 26.

Figure 8:
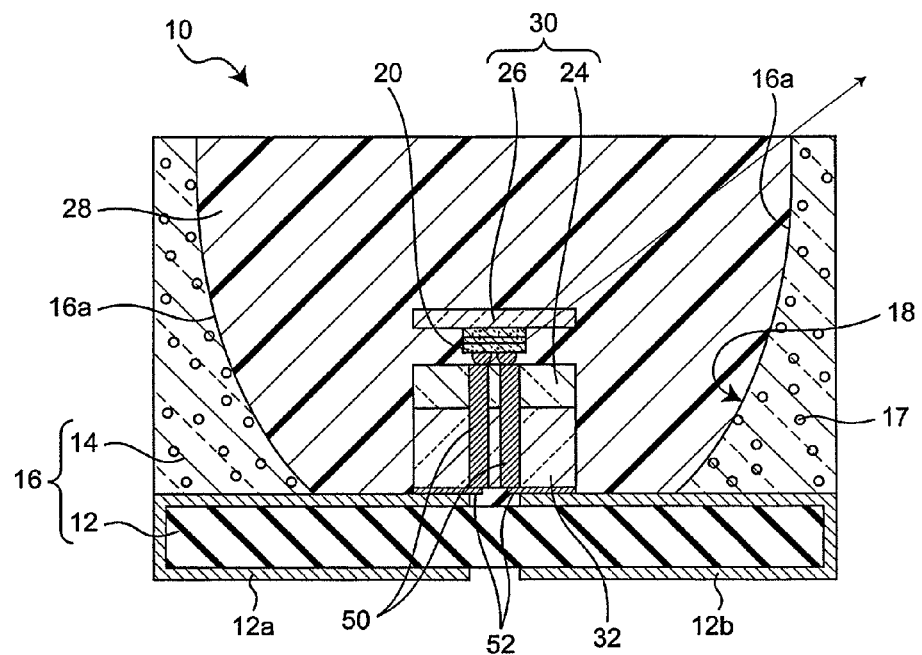
FIG. 8 is a schematic sectional view showing a light emitting device according to the third embodiment of the present invention.
Figure 9:
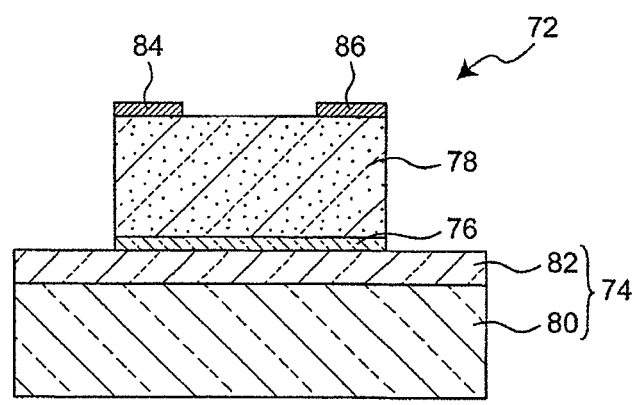
FIGS. 9(*a*) and 9(*b*) are schematic cross-sectional views showing a conventional light emitting device.
Figure 9:
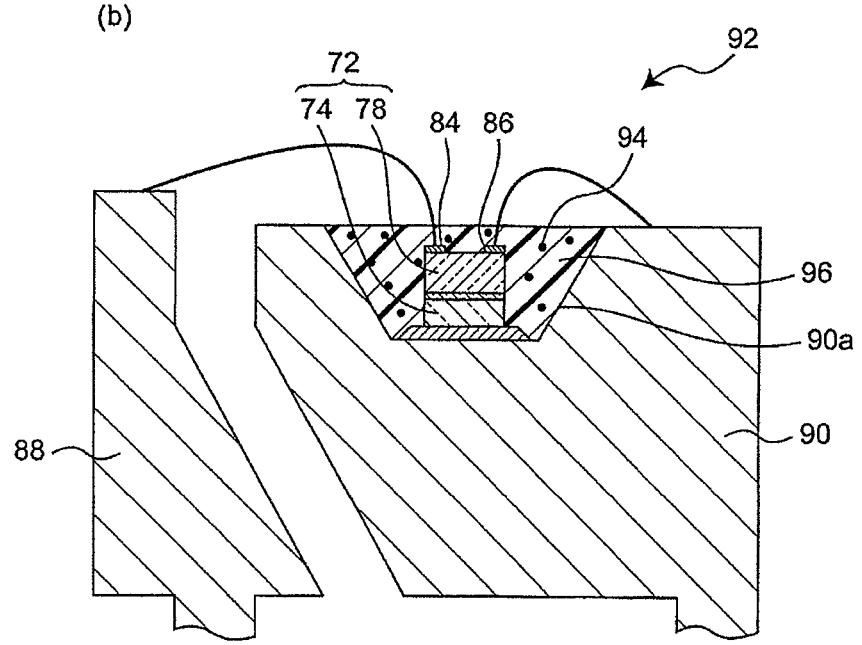

FIG. 8 is a schematic cross-sectional view showing a light emitting device according to the third embodiment of the present invention. In the present embodiment, both the first wavelength converting member 24 and the second wavelength converting member 26 have a plate shape and the side surfaces of the semiconductor light emitting element 20 are exposed without being covered by the wavelength converting member 30. Via holes are provided each passing through the first wavelength converting member 24 and the supporting member 32, and through the conductive material 50 filled in the via holes, electric connection is established with the respective wirings 12a, 12b of the mounting substrate. This embodiment is similar to the first embodiment in other respects.

The wavelength converting member 30 of the present embodiment includes the first wavelength converting member 24 connected to the bottom surface of the light emitting element 20, and the second wavelength converting member 26 being in contact with the top surface of the light emitting element 20. The second wavelength converting member 26 is preferably such that the outer size in planar direction is larger than that of the light emitting element 20 and protruding in a flange shape from the top edge of the light emitting element 20.

This arrangement allows the emission from the top surface of the light emitting element 20 passes through the second wavelength converting member 26 before it is extracted to the outside. For example, in the case where the size of the second wavelength converting member 26 is substantially the same as that of the light emitting element 20, oblique emission from the side surfaces of the light emitting layer 38 may not pass through the second wavelength converting member 26 and not scattered at the surface defining the recess portion 16a. Therefore, as shown in FIG. 8, the second wavelength converting member 26 is formed larger than the light emitting element 20 so that it projects in a flange shape from the top edge of the light emitting element 20. This arrangement allows all the emission from the light emitting layer 38 of the light emitting element 20 which is not scattered at the recess portion 16a to passes through the second wavelength converting member 16a. The size and the planar shape of the second wavelength converting member 26 is not specifically limited as long as the flange portion of the second wavelength converting member 26 projects from the top edge of the light emitting element 20 to a degree that enables the above. But, if the size of the second wavelength converting member 26 is too large, the light scattered at the recess portion 16a will pass through the second wavelength converting member 26 again, which may cause occurrence of color unevenness, reduction in emission output, or the like. In the present embodiment, the maximum size of the second wavelength converting member 26 in planar direction is 1.1 times or greater, preferably 1.5 times or greater, and 3 times or less, more preferably 2 times or less than the maximum size of the light emitting layer 38 of the light emitting element 20 in planar direction.

As in the present embodiment, with the second wavelength converting member 26 formed in a plate shape which is protruded from the light emitting element 20 as a flange, the side surfaces of the light emitting element 20 can be exposed from the wavelength converting member 30 while suppressing occurrence of the color unevenness. Exposing the side surfaces of the light emitting element 20 without covering them with the wavelength converting member 30 enables to reduce the returning light into the light emitting element 20 and also to prevent the deterioration of the second wavelength converting member 26 due to the heat generated from the light emitting element 20. That is, in the case where the top surface and the side surfaces of the light emitting element 20 are covered with the second wavelength converting member 26, light is scattered by the particles of the fluorescent material contained in the second wavelength converting member 26, so that the not a little amount of light returns in the light emitting element 20. As in the present embodiment, with the side surfaces of the light emitting element 20 being exposed without being covered with the wavelength converting member 30, the probability of light emitted from the side surfaces of the light emitting element 20 returning to the light emitting element 20 decreases significantly, so that emission of the light emitting element 20 can be extracted more efficiently. In addition, the contact area between the second wavelength converting member 26 and the light emitting element 20 decreases, so that deterioration of the second wavelength converting member 26 due to the heat generated from the light emitting element 20 can also be suppressed Meanwhile, in the case of a conventional light emitting device where the side surfaces of the light emitting element 20 are simply exposed without covering with the wavelength converting member 30, light emitted from the side surfaces of the light emitting element 20 is extracted outside without passing through the wavelength converting member 30, so that significant color unevenness may occur. In the case of a light emitting device provided with a recess portion sealed with a sealing member 28, a part of light undergoes total internal reflection at the interface between the sealing member 28 and the air and returns in the recess portion, but significant color unevenness may still remain. In the present embodiment, light emitted from the side surfaces of the light emitting element 20 is scattered at the recess portion 16a and then mixed with the light whose wavelength is converted by the wavelength converting member 20, so that occurrence of color unevenness can be prevented.

Although it is also preferable in the present embodiment that the light scattering surface 18 formed on the surface defining the recess portion 16a is formed as wide region as possible, the light scattering surface 18 is to be formed at least a portion of the side surface of the recess portion 16a, more preferably to be formed on the entire portion of the side surface thereof. With such arrangements, the color unevenness can be suppressed efficiently. That is, one the cause of the color unevenness attributes to a difference in the length of optical path that the light emitted from the light emitting element 20 passes through the wavelength converting member 30. The light travelling from the light emitting element 20 to the bottom surface of the recess portion 16a is irradiated on the wavelength converting member 30 from the front side, so that the length of the optical path of the wavelength converting member 30 can be relatively uniform, and thus occurrence of the color unevenness tends not to be caused. On the other hand, light obliquely propagating from the light emitting element 20 to the side surface of the recess portion 16a is emission obliquely propagating in the wavelength converting member 30, so that color unevenness due to the difference in the length of the optical path of the wavelength converting member 30 tends to occur. In the case where the wavelength converting member 30 has a plate shape, a part of the light in the wavelength converting member 30 undergoes total internal reflection at the opposing two principal surfaces, and is emitted from the side surfaces. Thus, light emitted from the side surface has a longer optical path in the wavelength converting member, so that the intensity of the light whose wavelength is converted tends to be increased, and the color unevenness is essentially likely to occur.

Particularly, as in the present embodiment, in the case where the side surfaces of the light emitting element 20 are exposed without being covered with the wavelength converting member 30, color unevenness due to the light emitted from the side surfaces of the light emitting element 20 tends to occur. On the contrary, with the light emitting element 20 disposed substantially in parallel with the bottom surface of the recess 16a, the light emitted from the side surfaces of the light emitting element 20 is most likely incident to the regions in the side surface of the recess portion 16a, which are facing the side surfaces of the light emitting layer 38. Therefore, it is preferable that the light scattering surface is formed on the side surface of the recess portion 16a to specifically include the region facing the side surfaces of the light emitting layer 38. This arrangement enables to effectively suppress the color unevenness caused by the side surfaces of the light emitting element 20 being exposed without being covered with the wavelength converting member.

The second wavelength converting member 26 of the present embodiment is preferably made of an inorganic material as in the first wavelength converting member 24 of the first embodiment. The second wavelength converting member 26 made of such a material has higher durability and higher mechanical strength, which facilitates forming the second wavelength converting member 26 in a plate shape which projects around the top edge of the light emitting element 20 like a flange. Forming the first wavelength converting member 24 and the second wavelength converting member 26 with the same material enables reduction in the manufacturing cost by communalizing the members, which also allows the stress induced by the difference in the thermal expansion coefficient and applied to the top and the bottom surfaces of the light emitting element 20 to be uniform, thus contributing to the improvement of the reliability of the light emitting device 10.

Via holes are provided each passing through the first wavelength converting member 24 and the supporting member 32, and through the conductive material 50 filled in the via holes, electric connection is established with the respective wirings 12a, 12b of the mounting substrate. The conductive material 50 and the respective wirings 12a, 12b of the mounting substrate may be bonded by using an appropriate material such as a solder, a metal eutectic, or the like. Further improvement in the heat dissipation of the light emitting element 20 can be obtained by directly connecting the light emitting element 20 and the respective wirings 12a, 12b through the conductive material 50, as in the present embodiment. For the conductive material 50, a material having high heat conductivity and electric conductivity is preferable and, for example, Cu, Ag, Au, Ni, or the like can be used. Further, filling such conductive material 50 in the via holes allows the conductive material 50 to be used as a reflecting portion. With this arrangement, light in the first wavelength converting member 24 and the supporting member 32 can be reflected and extracted toward the light scattering surface 18.

Moreover, as in the present embodiment, in the case where a light blocking member such as a metal member which is capable of substantially blocking light is disposed in the supporting member, such light blocking member is preferably disposed at a position overlapping the light emitting element 20 in top view. This is because disposing a light blocking member such as a metal member at a position outside of the light emitting element 20 may result in blocking light of specific direction with respect to the light emitting element 20, which may cause occurrence of strong color unevenness. Generally, in a light emitting element 20 mounted by flip-chip manner as shown in FIG. 8, a reflection electrode is disposed at the mounting surface side, so that small amount of light is to be extracted from the bottom of the light emitting element 20. Therefore, even the light blocking member is disposed under the light emitting element 20, the light emission from the light emitting element 20 may hardly blocked.

The embodiments described above are mere examples, and the present invention is not restricted to these embodiments. Components of the present invention are not limited to the constitution based on the members of the embodiments described above, and a plurality of components of the present invention may be constituted from a single member, or one component may be constituted from a plurality of members. It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:

1. A light emitting device comprising:
    a package having a recess portion opening upwardly, the recess portion comprising a side surface and a bottom surface;
    a light emitting element comprising a light emitting layer comprising a semiconductor;
    a wavelength converting member configured to absorb part of light emitted from the light emitting element, convert the absorbed light into light of a different wavelength and emit the converted light, the light emitted from the light emitting element and the light converted by the wavelength converting member being mixed and emitted from an opening of the recess portion, the wavelength converting member comprising a first wavelength converting member disposed under the light emitting element and a second wavelength converting member disposed on at least the light emitting element, the first wavelength converting member being of a plate shape and comprising a composite of an inorganic material and a fluorescent material;
    a supporting member disposed between the first wavelength converting member and the bottom surface of the package; and
    a light scattering surface formed on at least a portion of the side surface of the recess portion which is irradiated with incident light emitted from a side surface of the first wavelength converting member in a direction parallel to a principal surface of the first wavelength converting member,
    wherein the light emitting element and the wavelength converting member are apart from the side surface of the package.

2. The light emitting device of claim 1, wherein the second wavelength converting member comprises a light transmissive resin and a fluorescent material dispersed in the light transmissive resin.

3. The light emitting device of claim 2, wherein a difference in refractive index between the light transmissive resin and the fluorescent material in the second wavelength converting member is larger than a difference in refractive index between the inorganic material and the fluorescent material in the first wavelength converting member.

4. The light emitting device of claim 1, wherein the first wavelength converting member has a thickness greater than a thickness of the light emitting element.

5. The light emitting device of claim 1, wherein the first wavelength converting member has a thickness greater than a thickness of the second wavelength converting member.

6. The light emitting device of claim 1, wherein a concentration of the fluorescent material in the first wavelength converting member is higher than a concentration of the fluorescent material in the second wavelength converting member.

7. The light emitting device of claim 1, wherein a top surface and a side surface of the light emitting element are covered with the second wavelength converting member.

8. The light emitting device of claim 1, wherein a side surface of the first wavelength converting member is not covered with the second wavelength converting member.

9. The light emitting device of claim 1, wherein the second wavelength converting member is not in contact with the first wavelength converting member.

10. A light emitting device comprising:
    a package having a recess portion comprising a bottom surface and a side surface, at least part of the side surface being configured to scatter light;
    a supporting member disposed on the bottom surface of the recess portion;
    a first wavelength converting member disposed on the supporting member and including no scattering agents;
    a light emitting element disposed on the first wavelength converting member; and
    a second wavelength converting member disposed on the light emitting member and including scattering agents.

11. A light emitting device comprising:
    a package having a recess portion comprising a bottom surface and a side surface, at least part of the side surface being configured to scatter light;
    a supporting member disposed on the bottom surface of the recess portion;
    a first wavelength converting member disposed on the supporting member and comprising a first fluorescent material having a first concentration;
    a light emitting element disposed on the first wavelength converting member; and
    a second wavelength converting member disposed on the light emitting member and comprising a second fluorescent material having a second concentration lower than the first concentration.

12. A light emitting device comprising:
    a package having a recess portion comprising a bottom surface and a side surface, at least part of the side surface being configured to scatter light;
    a supporting member disposed on the bottom surface of the recess portion;
    a first wavelength converting member disposed on the supporting member so as to have a flat shape and comprising an inorganic material and a fluorescent material dispersed in the inorganic material;
    a light emitting element disposed on the first wavelength converting member; and
    a second wavelength converting member disposed on the light emitting member so as to have a curved portion and comprising a resin and a fluorescent material dispersed in the resin.

* * * * *